United States Patent [19]

Yusa et al.

[11] Patent Number: 5,605,763

[45] Date of Patent: Feb. 25, 1997

[54] ELECTRICALLY CONDUCTIVE BONDING FILMS

[75] Inventors: Masami Yusa, Shimodate; Shinji Takeda, Tsukuba; Takashi Masuko, Tsukuba; Yasuo Miyadera, Tsukuba; Mitsuo Yamazaki, Takahagi, all of Japan

[73] Assignee: Hitachi Chemical Company Ltd., Japan

[21] Appl. No.: 560,182

[22] Filed: Nov. 20, 1995

Related U.S. Application Data

[63] Continuation of Ser. No. 122,868, Sep. 16, 1993, abandoned.

[30] Foreign Application Priority Data

Sep. 16, 1992 [JP] Japan .................... 4-245395
Sep. 17, 1992 [JP] Japan .................... 4-247758
Aug. 4, 1993 [JP] Japan .................... 5-193452

[51] Int. Cl.⁶ .................... B32B 27/18; C09J 7/00
[52] U.S. Cl. .................... 428/473.5; 428/209; 428/323; 428/328; 428/458; 428/901; 252/512; 525/928; 156/306.6; 156/327; 528/351; 528/353
[58] Field of Search .................... 428/209, 323, 428/328, 344, 349, 355, 356, 458, 473.5, 901; 252/512, 514; 525/928; 528/351, 353, 365, 322, 86, 170; 156/306.6, 327, 330, 330.9

[56] References Cited

U.S. PATENT DOCUMENTS

| | | | |
|---|---|---|---|
| 4,012,555 | 3/1977 | Keske | 428/383 |
| 4,064,289 | 12/1977 | Yokoyama et al. | 427/82 |
| 4,557,860 | 12/1985 | Di Salvo et al. | 252/512 |
| 4,681,928 | 7/1987 | Berger et al. | 528/353 |
| 4,692,272 | 9/1987 | Goswami et al. | 252/514 |
| 4,714,726 | 12/1987 | Ketley | 524/11 |
| 4,883,718 | 11/1989 | Ohta et al. | 428/458 |
| 4,959,008 | 9/1990 | Wasulko | 428/40 |
| 5,115,089 | 5/1992 | Yoshida et al. | 528/353 |
| 5,204,399 | 4/1993 | Edelman | 524/404 |

FOREIGN PATENT DOCUMENTS

| | | |
|---|---|---|
| 1-163214 | 6/1989 | Japan . |
| 2-120383 | 5/1990 | Japan . |
| 3-192178 | 8/1991 | Japan . |

OTHER PUBLICATIONS

"Die Bonding Film Adhesive Simplifies Automation" by William M. Wasulko, et al., reported in Microelectronic Manufacturing and Testing, Oct., 1985, published by Lake Publishing Corporation, in U.S.A. (English reference).
Grant& Hackh's Chemical Dictionary, Fifth Edition, 1987, p. 235.
Webster's II New Riverside University Dictionary, 1994, p. 478.

Primary Examiner—Patrick Ryan
Assistant Examiner—Marie R. Yamnitzky
Attorney, Agent, or Firm—Pennie & Edmonds

[57] ABSTRACT

Described is an electrically conductive bonding film useful in bonding an IC or LSI with a lead frame. The film comprises (A) a polyimide resin obtained by reacting a tetracarboxylic dianhydride component, in which the content of a tetracarboxylic dianhydride represented by the following formula (I):

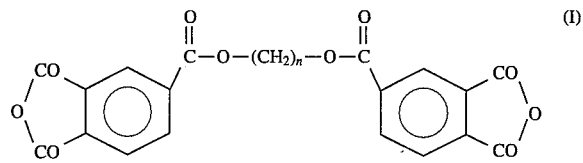

wherein n stands for an integer of 2–20 amounts to at least 70 mole %, with a diamine; (B) an electrically conductive filler, and a thermoset resin. Optionally, the film may further comprises a thermosetting resin or an imide compound having at least two thermally-crosslinking imido groups per molecule.

9 Claims, No Drawings

ELECTRICALLY CONDUCTIVE BONDING FILMS

This is a continuation of application Ser. No. 08/122,868, filed Sep. 16, 1993, now abandoned.

BACKGROUND OF THE INVENTION

1) Field of the Invention

This invention relates to a bonding material for an IC or LSI and a lead frame, that is, an electrically conductive bonding film useful as a die bonding material. Further, this invention is concerned with a production process of the electrically conductive bonding film and also with a bonding method making use of the electrically conductive bonding film. The term "electrically conductive" will hereinafter be referred to simply as "conductive" for the sake of brevity, so that the term "conductive" as used herein means "electrically conductive" unless otherwise specifically indicated.

2) Description of the Related Art

Conventionally, Au—Si eutectic alloy, solder, silver paste or the like has been used to bond an IC or LSI with a lead frame.

Au—Si eutectic alloy has high heat resistance and moisture resistance but, for its high modulus of elasticity, is accompanied by the problems that it is prone to breakage when applied to a large chip and is costly.

Solder is inexpensive but is inferior in heat resistance. Further, its modulus of elasticity is high like Au—Si eutectic alloy, thereby making it difficult to apply it to large chips.

Silver paste, on the other hand, is economical and has high moisture resistance. Its modulus of elasticity is the lowest among the three bonding materials described above. It also has heat resistance sufficient to permit application of 350° C. thermo-compression wire bonding, so that silver paste is now a primary bonding material for ICs or LSIs and lead frames.

Keeping step with the high densification of an IC or LSI in recent years, chips are becoming larger. Upon bonding an IC or LSI on a lead frame with silver paste, the above trend has led to difficulties in spreading and coating the silver paste on the entire surface of the chip.

In "MICROELECTRONIC MANUFACTURING AND TESTING", October, 1985, there is reported a conductive bonding film which contains a conductive filler filled in a thermoplastic resin and is useful in die bonding. This conductive bonding film is heated approximately to the melting point of the thermoplastic resin and is then compressed to achieve bonding.

In the conductive bonding film reported in the above magazine, selection and use of a thermoplastic resin having a low melting point make it possible to lower the bonding temperature. This can reduce damage to chips such as oxidation of a lead frame. However, its bonding force under heat is low so that it cannot withstand heat treatments after die bonding, such as wire bonding and packaging process. Use of a thermoplastic resin having a melting point high enough to withstand such heat treatments however results in a high bonding temperature. This has led to the potential problem that chips may be damaged such as oxidation of a lead frame.

SUMMARY OF THE INVENTION

An object of this invention is to provide a die-bonding, conductive bonding film which permits heat treatment at relatively low temperatures upon die bonding like conventional silver paste and has high bonding force under heat.

In one aspect of the present invention, there is thus provided an electrically conductive bonding film comprising:

(A) a polyimide resin obtained by reacting a tetracarboxylic dianhydride component, in which the content of a tetracarboxylic dianhydride represented by the following formula (I):

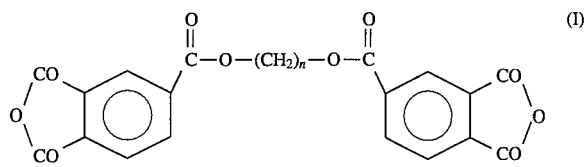

wherein n stands for an integer of 2–20 amounts to at least 70 mole %, with a diamine; and (B) an electrically conductive filler.

In another aspect of the present invention, there is also provided a method for bonding a semiconductor chip with a substrate, which comprises interposing the above electrically conductive bonding film between the chip and the substrate and then subjecting the chip, the film and the substrate to thermocompression bonding.

The conductive bonding film according to the present invention makes it possible to perform die bonding at a relatively low temperature.

The bonding method according to the present invention facilitates bonding of the semiconductor chip with the substrate.

DETAILED DESCRIPTION OF THE INVENTION AND PREFERRED EMBODIMENTS

The conductive bonding film according to the present invention can be produced, for example, by (1) dissolving in an organic solvent 100 parts by weight of the polyimide resin obtained by reacting the tetracarboxylic dianhydride component, in which the content of the tetracarboxylic dianhydride represented by the formula (I) amounts at least 70 mole %, with the diamine, (2) adding and mixing 1–8,000 parts by weight of the conductive filler (B) with the resulting solution, and (3) coating the thus-formed coating formulation on a base film, followed by heating.

Examples of the tetracarboxylic dianhydride of the formula (I), said dianhydride being useful as a raw material for the above-described polyimide, include:
when n=2 to 5:
1,2-(ethylene)bis(trimellitate anhydride);
1,3-(trimethylene)bis(trimellitate anhydride);
1,4-(tetramethylene)bis(trimellitate anhydride); and
1,5-(pentamethylene)bis(trimellitate anhydride).
when n=6 to 20:
1,6-(hexamethylene)bis(trimellitate anhydride);
1,7-(heptamethylene)bis(trimellitate anhydride);
1,8-(octamethylene)bis(trimellitate anhydride);
1,9-(nonamethylene)bis(trimellitate anhydride);
1,10-(decamethylene)bis(trimellitate anhydride);
1,12-(dodecamethylene)bis(trimellitate anhydride);
1,16-(hexadecamethylene)bis(trimellitate anhydride); and
1,18-(octadecamethylene)bis(trimellitate anhydride).
These tetracarboxylic dianhydrides can be used either singly or in combination.

The above tetracarboxylic dianhydrides can each be synthesized from trimellitic anhydride monochloride and the corresponding diol.

The above tetracarboxylic dianhydride is contained in an amount of 70 mole % or more based on the whole tetracarboxylic anhydride component. Amounts smaller than 70 mole % result in bonding films which require a high bonding temperature, so that such small amounts are not preferred.

Illustrative tetracarboxylic dianhydrides usable in combination with the tetracarboxylic dianhydride of the formula (I) include:
pyromellitic dianhydride;
3,3'4,4'-diphenyltetracarboxylic dianhydride;
2,2',3,3'-diphenyltetracarboxylic dianhydride;
2,2-bis(3,4-dicarboxyphenyl)propane dianhydride;
2,2-bis(2,3-dicarboxyphenyl)propane dianhydride;
1,1-bis(2,3-dicarboxyphenyl)ethane dianhydride;
1,1-bis(3,4-dicarboxyphenyl)ethane dianhydride;
bis(2,3-dicarboxyphenyl)methane dianhydride;
bis(3,4-dicarboxyphenyl)methane dianhydride;
bis(3,4-dicarboxyphenyl)sulfone dianhydride;
3,4,9,10-perylenetetracarboxylic dianhydride;
bis(3,4-dicarboxyphenyl)ether dianhydride;
benzene-1,2,3,4-tetracarboxylic dianhydride;
3,4,3',4'-benzophenonetetracarboxylic dianhydride;
2,3,2',3'-benzophenonetetracarboxylic dianhydride;
2,3,3',4'-benzophenonetetracarboxylic dianhydride;
1,2,5,6-naphthalene tetracarboxylic dianhydride;
2,3,6,7-naphthalenetetracarboxylic dianhydride;
1,2,4,5-naphthalenetetracarboxylic dianhydride;
1,4,5,8-naphthalenetetracarboxylic dianhydride;
2,6-dichloronaphthalene-1,4,5,8-tetracarboxylic dianhydride;
2,7-dichloronaphthalene-1,4,5,8-tetracarboxylic dianhydride;
2,3,6,7-tetrachloronaphthalene-1,4,5,8-tetracarboxylic dianhydride;
phenanthrene-1,8,9,10-tetracarboxylic dianhydride;
pyrazine-2,3,5,6-tetracarboxylic dianhydride;
thiophene-2,3,4,5-tetracarboxylic dianhydride;
2,3,3',4'-biphenyltetracarboxylic dianhydride;
3,4,3',4'-biphenyltetracarboxylic dianhydride;
2,3,2',3'-biphenyltetracarboxylic dianhydride;
bis(3,4-dicarboxyphenyl)dimethylsilane dianhydride;
bis(3,4-dicarboxyphenyl)methylphenylsilane dianhydride;
bis(3,4-dicarboxyphenyl)diphenylsilane dianhydride;
1,4-bis(3,4-dicarboxyphenyldimethylsilyl)benzene dianhydride;
1,3-bis(3,4-dicarboxyphenyl)-1,1,3,3-tetramethyldicyclohexane dianhydride;
p-phenylene-bis(trimellitate anhydride);
ethylenetetracarboxylic dianhydride;
1,2,3,4-butanetetracarboxylic dianhydride;
decahydronaphthalene-1,4,5,8-tetracarboxylic dianhydride;
4,8-dimethyl-1,2,3,5,6,7-hexahydronaphthalene-1,2,5,6-tetracarboxylic dianhydride;
cyclopentane-1,2,3,4-tetracarboxylic dianhydride;
pyrrolidine-2,3,4,5-tetracarboxylic dianhydride;
1,2,3,4-cyclobutanetetracarboxylic dianhydride;
bis(exo-bicyclo[2,2,1]heptane-2,3-dicarboxylic anhydride)sulfone;
bicyclo-(2,2,2)-oct(7)-ene-2,3,5,6-tetracarboxylic dianhydride;
2,2-bis(3,4-dicarboxyphenyl)hexafluoropropane dianhydride;
2,2-bis[4-(3,4-dicarboxyphenoxy)phenyl]hexafluoropropane dianhydride;
4,4'-bis(3,4-dicarboxyphenoxy)diphenyl sulfide dianhydride;
1,4-bis(2-hydroxyhexafluoroisopropyl) benzenebis(trimellitic anhydride);
1,3-bis(2-hydroxyhexafluoroisopropyl)benzenebis(trimellitic anhydride);
5-(2,5-dioxotetrahydrofuryl)-3-methyl-3-cyclohexene-1,2-dicarboxylic anhydride; and
tetrahydrofuran-2,3,4,5-tetracarboxylic dianhydride.

The above tetracarboxylic dianhydrides can be used either singly or in combination.

Illustrative of the diamine employed in this invention include:
aliphatic diamines such as:
1,2-diaminoethane,
1,3-diaminopropane,
1,4-diaminobutane,
1,5-diaminopentane,
1,6-diaminohexane,
1,7-diaminoheptane,
1,8-diaminooctane,
1,9-diaminononane,
1,10-diaminodecane,
1,11-diaminoundecane, and
1,12-diaminododecane; as well as
aromatic diamines such as:
o-phenylenediamine,
m-phenylenediamine,
p-phenylenediamine,
3,3'-diaminodiphenyl ether,
3,4'-diaminodiphenyl ether,
4,4'-diaminodiphenyl ether,
3,3'-diaminodiphenylmethane,
3,4'-diaminodiphenylmethane,
4,4'-diaminodiphenylmethane,
3,3'-diaminodiphenyldifluoromethane,
3,4'-diaminodiphenyldifluoromethane,
4,4'-diaminodiphenyldifluoromethane,
3,3'-diaminodiphenyl sulfone,
3,4'-diaminodiphenyl sulfone,
4,4'-diaminodiphenyl sulfone,
3,3'-diaminodiphenyl sulfide,
3,4'-diaminodiphenyl sulfide,
4,4'-diaminodiphenyl sulfide,
3,3'-diaminodiphenyl ketone,
3,4'-diaminodiphenyl ketone,
4,4'-diaminodiphenyl ketone,
2,2-bis(3-aminophenyl) propane,
2,2'-(3,4'-diaminodiphenyl propane,
2,2-bis(4-aminophenyl) propane,
2,2-bis(3-aminophenyl)hexafluoropropane,
2,2-(3,4'-diaminodiphenyl)hexafluoropropane,
2,2-bis(4-aminophenyl)hexafluoropropane,
1,3-bis(3-aminophenoxy)benzene,
1,4-bis(3-aminophenoxy)benzene,
1,4-bis(4-aminophenoxy)benzene,
3,3'-(1,4-phenylenebis(1-methylethylidene))-bisaniline,
3,4'-(1,4-phenylenebis(1-methylethylidene))-bisaniline,
4,4'-(1,4-phenylenebis(1-methylethylidene))-bisaniline,
2,2-bis(4-(3-aminophenoxy)phenyl)propane,
2,2-bis(4-(4-aminophenoxy)phenyl)propane,
2,2-bis(4-(3-aminophenoxy)phenyl)hexafluoropropane,
2,2-bis(4-(4-aminophenoxy)phenyl)hexafluoropropane,
bis(4-(3-aminophenoxy)phenyl) sulfide,
bis(4-(4-aminophenoxy)phenyl) sulfide,
bis(4-(3-aminophenoxy)phenyl) sulfone, and
bis(4-(4-aminophenoxy)phenyl) sulfone.

The condensation reaction between the tetracarboxylic dianhydride and the diamine is conducted in an organic solvent. In this case, it is preferred to use the tetracarboxylic dianhydride and the diamine at an equimolar ratio or at substantially an equimolar ratio. The respective reactants can be added in an arbitrary order.

Usable examples of the organic solvent include dimethylacetamide, dimethylformamide, N-methyl-2-pyrrolidone, dimethyl sulfoxide, hexamethylphosphorylamide, m-cresol, and o-chlorophenol.

The reaction temperature is below 80° C., preferably from 0° C. to 50° C. As the reaction proceeds, the viscosity of the reaction mixture increases gradually. It is here that a polyamic acid as a precursor of the polyimide is formed.

The polyimide can be obtained by causing the reaction product (polyamic acid) to undergo dehydration and ring closure. The dehydration and ring closure can be conducted by subjecting the reaction product to heat treatment at 120°–250° C. or by using a chemical process. When heat treated at 120°–250° C., it is desired to conduct the heat treatment while eliminating water, which occurs through the dehydration reaction, from the system. Here, benzene, toluene, xylene or the like can be used to azeotropically eliminate the water.

It is to be noted that the term "polyimide resin" as used herein collectively embraces polyimides and precursors thereof. Such polyimide precursors include polyamic acids and partially-imidated derivatives thereof.

To achieve dehydration and ring closure by the chemical process, an acid anhydride such as acetic anhydride, propionic anhydride or benzoic anhydride or a carbodiimide compound such as dicyclohexylcarbodiimide is used as a ring-closing agent. Here, a ring-closing catalyst such as pyridine, isoquinoline, trimethylamine, aminopyridine or imidazole can also be used as needed. The ring-closing agent or ring-closing catalyst may be used preferably in an amount ranging from 1 to 8 moles per mole of the whole tetracarboxylic dianhydride component.

Further, to improve the bonding strength, the polyimide resin can be added with a silane coupling agent, a titanium-base coupling agent, a non-ionic surfactant, a fluorine-containing surfactant, a silicone-type additive and/or the like as desired.

The conductive filler (B) employed in the present invention is added to impart electrical conductivity to the bonding agent. Powders of electrically conductive metals, such as silver powder, gold powder and copper powder, are used either singly or in combination. Inorganic insulating materials such as silica, alumina, titania, glass or iron oxide can be added to such conductive powders to extents not impairing the conductivity.

The proportion of the conductive filler can be 1–8,000 parts by weight, preferably 50–4,000 parts by weight per 100 parts by weight of the polyimide resin. Amounts smaller than 1 part by weight cannot obtain sufficient electrical conductivity, whereas amounts greater than 8,000 parts lead to reduced bonding ability.

Production of the conductive bonding film according to the present invention can be carried out in the following manner. First, the polyimide resin is dissolved in an organic solvent. No particular limitation is imposed on the organic solvent used here as long as it permits uniform dissolution or kneading of the polyimide resin. Exemplary organic solvents include dimethylformamide, dimethylacetamide, N-methylpyrrolidone, dimethyl sulfoxide, diethylene glycol dimethyl ether, toluene, benzene, xylene, methyl ethyl ketone, tetrahydrofuran, ethylcellosolve, ethylcellosolve acetate, butylcellosolve, and dioxane.

The conductive filler is next added, followed by the incorporation of additives if any. The batch so prepared is then mixed. As an alternative, the batch can be kneaded by suitably combining a conventional mixer with a dispersion mixer such as a mix-muller, a three-roll mill or a ball mill.

A paste-like mixture obtained as described above is then evenly coated, for example, onto a base film such as a polyester sheet. The base film so coated is then heated under conditions sufficient to achieve full evaporation of the solvent employed, namely, at about 60°–220° C. for 0.1–30 minutes, whereby a conductive bonding film is produced. The base film is usually removed before the conductive bonding film is used for bonding purpose.

The conductive bonding film according to the present invention may further comprise, in addition to the polyimide resin (A) an the conductive filler (B), (C) a thermosetting resin or (C') a compound capable of forming a thermosetting resin when heated. The proportion of the thermosetting resin (C) or the compound (C') may range preferably from 0.1 to 200 parts by weight per 100 parts by weight of the polyimide resin.

The thermosetting resin (C) can be a resin which comprises an epoxy resin, a phenol resin and a curing promoter. The compound (C'), which is capable of forming a thermosetting resin when heated, can be selected from imide compounds containing at least two thermally-crosslinking imido groups per molecule.

Where the thermosetting resin (C) is a resin comprising an epoxy resin, a phenol resin and a curing promoter, the conductive bonding film can be produced by (1) dissolving, in an organic solvent, 100 parts by weight of the polyimide resin (A), 0.01–200 parts by weight of an epoxy resin, 2–150 parts by weight of a phenol resin and 0.01–50 parts by weight of a curing promoter, the amounts of both the phenol resin and the curing promoter being per 100 parts of the epoxy resin the sum of the amounts of the epoxy resin, phenol resin and curing promoter ranging from 0.1 part by weight to 200 parts by weight, (2) adding and mixing 1–8,000 parts by weight of the conductive filler (B), and then (3) coating the resulting coating formulation on a base film and heating the same.

Where the compound (C'), which is capable of forming a thermosetting resin when heated, is an imide compound containing at least two thermally-crosslinking imido groups per molecule, the conductive bonding film can be produced by (1) dissolving, in an organic solvent, 100 parts by weight of the polyimide resin (A) and 0.1–200 parts by weight of the imide compound, (2) adding and mixing the conductive filler (B) and then (3) coating the resulting coating formulation on a base film and heating the same.

The conductive bonding film which contains the thermosetting resin or the compound capable of forming a thermosetting resin when heated features high shear bonding strength under heat. Its peel bonding strength under head is however low conversely. It is therefore desirous to selectively use, depending on the application purpose, either the conductive bonding film containing the thermosetting resin or the compound capable of forming a thermosetting resin when heated or the conductive bonding film free of the thermosetting resin or the compound. Incidentally, the term "thermosetting resin" as used herein means a resin which, when heated, forms a three-dimensional network structure and hardens.

When the thermosetting resin is incorporated, the amount of the thermosetting resin may be preferably 0.1–200 parts by weight, more preferably 1–100 parts by weight per 100 parts by weight of the polyimide resin (A). Amounts greater than 200 parts by weight may lead to poor film-forming property.

When a resin consisting of an epoxy resin, a phenol resin and a curing promoter is chosen as the thermosetting resin, the epoxy resin to be used is preferably one containing at least two epoxy groups per molecule. From the standpoints of curability and the properties of a cured product, an epoxy resin of the phenol glycidyl ether type is more preferred.

Examples of such resins include condensation products between bisphenol A, bisphenol AD, bisphenol S, bisphenol F and halogenated bisphenol As and epichlorohydrin; the glycidyl ether of phenol novolak resin; the glycidyl ether of cresol novolak resin; and the glycidyl ether of bisphenol A novolak resin.

The amount of the epoxy resin can be preferably 1–200 parts by weight, more preferably 5–100 parts by weight per 100 parts by weight of the polyimide resin. Amounts greater than 200 parts by weight may lead to poor film-forming property.

The phenol resin preferably contains at least two phenolic hydroxyl groups per molecule. Examples of such phenol resins include phenol novolak resin, cresol novolak resin, bisphenol A novolak resin, poly-p-vinylphenol, and phenolaralkyl resins.

The amount of the phenol resin can be preferably 2–150 parts by weight, more preferably 50–120 parts by weight per 100 parts by weight of the epoxy resin. Amounts smaller than 2 parts by weight or greater than 150 parts by weight may lead to insufficient curing property.

No particular limitation is imposed on the curing promoter insofar as it is usable to cure epoxy resins. Examples of such curing promoters include imidazoles, dicyandiamide derivatives, dicarboxylic dihydrazides, triphenylphosphine, tetraphenylphosphonium tetraphenylborate, 2-ethyl-4-methylimidazole tetraphenylborate, 1,8-diazabicyclo(5,4,0)undecene-7-tetraphenylborate. They may be used in combination.

The amount of the curing promoter can be preferably 0.01–50 parts by weight, more preferably 0.1–20 parts by weight, both per 100 parts by weight of the epoxy resin. Amounts smaller than 0.01 part by weight may lead to insufficient curing while amounts greater than 50 parts by weight may results in poorer storage stability.

Such a conductive bonding film can be produced as will be described below. First, the epoxy resin, the phenol resin and the polyimide resin are dissolved in an organic solvent. No particular limitation is imposed on the organic solvent employed here as long as it permits uniformly dissolution or kneading of the above materials. Illustrative of the organic solvent include the solvents referred to above, such as dimethylformamide.

The curing promoter, the conductive filler and, if any, additives are then added and, in a manner similar to that described above, are mixed or kneaded, whereby a paste-like mixture is obtained. The mixture is uniformly coated onto a base film and then heated, so that a conductive bonding film is formed on the base film.

Where an imide compound containing at least two thermally-crosslinking imido groups per molecule is used as a compound capable of forming a thermosetting resin, examples of the compound include orthobismaleimidobenzene, metabismaleimidobenzene, parabismaleimidobenzene, 1,4-bis(p-maleimidocumyl)benzene, and 1,4-bis(m-maleimidocumyl)benzene, In addition, there are also imide compounds represented by the following formulae (II) to (IV):

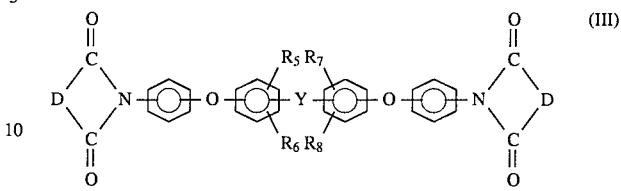

wherein X represents O, $CH_2$, $CF_2$, $SO_2$, S, CO, $C(CH_3)_2$ or $C(CF_3)_2$, $R_1$, $R_2$, $R_3$ and $R_4$ independently represent a hydrogen, fluorine, chlorine or bromine atom or a lower alkyl or lower alkoxyl group, and D represents a dicarboxylic acid residuum containing an ethylenically unsaturated double bond.

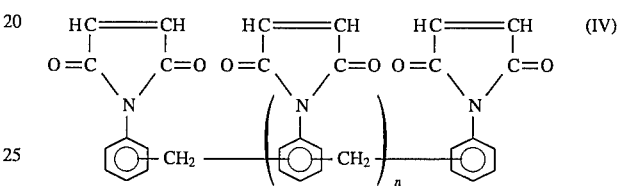

wherein Y represents O, $CH_2$, $CF_2$, $SO_2$, S, CO, $C(CH_3)_2$ or $C(CF_3)_2$, $R_5$, $R_6$, $R_7$ and $R_8$ independently represent a hydrogen, fluorine, chlorine or bromine atom or a lower alkyl or lower alkoxyl group, and D represents a dicarboxylic acid residuum containing an ethylenically unsaturated double bond.

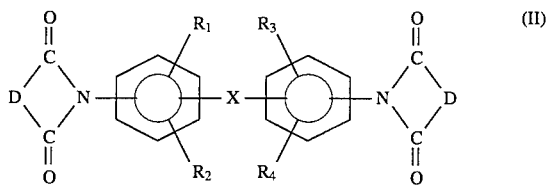

wherein n stands for an integer of 0–4.

The amount of the imide compound employed in this invention can be preferably 0.1–200 parts by weight, more preferably 1–100 parts by weight per 100 parts by weight of the polyimide resin. Amounts greater than 200 parts by weight may lead to poorer film-forming property.

Illustrative imide compounds of formula (II) include:
4,4-bismaleimidodiphenyl ether,
4,4-bismaleimidodiphenylmethane,
4,4-bismaleimido-3,3'-dimethyldiphenylmethane,
4,4-bismaleimidodiphenyl sulfone,
4,4-bismaleimidodiphenyl sulfide,
4,4-bismaleimidodiphenyl ketone,
2,2'-bis(4-maleimidophenyl)propane,
4,4-bismaleimidodiphenylfluoromethane, and
1,1,1,3,3,3,-hexafluoro-2,2-bis(4-maleimidophenyl)propane.

Exemplary imide compounds of formula (III) include:
bis[4-(4-maleimidophenoxy)phenyl]ether,
bis[4-(4-maleimidophenoxy)phenyl]methane,
bis[4-(4-maleimidophenoxy)phenyl]fluoromethane,
bis[4-(4-maleimidophenoxy)phenyl]sulfone,
bis[4-(4-maleimidophenoxy)phenyl]sulfide,
bis[4-(4-maleimidophenoxy)phenyl]ketone,
2,2-bis[4-(4-maleimidophenoxy)phenyl]propane, and
1,1,1,3,3,3-hexafluoro-2,2-bis[4-(4-maleimidophenoxyphenyl]propane.

To promote polymerization of such an imide compound, a free-radical polymerization initiator can be used. Usable free-radical polymerization initiators include, for example, acetylcyclohexylsulfonyl peroxide, isobutyryl peroxide, benzoyl peroxide, octanoyl peroxide, acetyl peroxide, dicumyl peroxide, cumene hydroperoxide, and azobisisobutylonitrile. The free-radical polymerization initiator can be used preferably in an amount ranging approximately from 0.01 part by weight to 1.0 part by weight per 100 parts by weight of the imide compound.

In the above case, a conductive bonding film can be produced in the following manner.

First, the polyimide resin (A) and the above imide compound are weighed and are then dissolved in an organic solvent in a manner similar to that described above. The conductive filler and, if any, additives are added, followed by mixing or kneading to obtain a paste-like mixture. The mixture is then evenly coated onto a base film and heated, whereby a conductive bonding film is formed on the base film.

A semiconductor chip such as an IC and/or LSI can be bonded to a substrate such as a lead frame, ceramic circuit board, glass circuit board or glass-polyimide circuit board when a conductive bonding film obtained in accordance with the present invention is interposed between the chip and the substrate and then compressed under heat.

The present invention will hereinafter be described by the following Examples.

Synthesis Example 1

In a 500-ml four-neck flask equipped with a thermometer, a stirrer and a calcium chloride tube, 41 g (0.1 mole) of 2,2-bis(4-aminophenoxyphenyl)propane and 150 g of dimethylacetamide were placed and stirred. Subsequent to dissolution of the diamine, 41 g (0.1 mole) of 1,2-(ethylene)bis(trimellitate dianhydride) were added little by little while cooling the flask over an ice bath. After they were reacted at room temperature for 3 hours, 30 g of xylene were added. While sparging $N_2$ gas, the reaction mixture was heated at 150° C. so that xylene was azeotropically eliminated together with water. The reaction mixture was then poured into water. A precipitated polymer was collected by filtration and dried, whereby a polyimide resin ($A_1$) was obtained.

Synthesis Example 2

In a 500-ml four-neck flask equipped with a thermometer, a stirrer and a calcium chloride tube, 43.2 g (0.1 mole) of bis(4-(3-aminophenoxy)phenyl)sulfone and 150 g of N-methyl-2-pyrrolidone were placed and stirred. Subsequent to dissolution of the diamine, 43.8 g (0.1 mole) of 1,4-(tetramethylene)bis(trimellitate dianhydride) were added at room temperature. They were reacted at 5° C. or lower for 5 hours, followed by the addition of 20.4 g (0.2 mole) of acetic anhydride and 15.8 g (0.2 mole) of pyridine. The mixture so obtained was stirred for 1 hour at room temperature. The reaction mixture was poured into water. A precipitated polymer was collected by filtration and dried, whereby a polyimide resin ($A_2$) was obtained.

Synthesis Example 3

In a 500-ml four-neck flask equipped with a thermometer, a stirrer and a calcium chloride tube, 32.8 g (0.08 mole) of 2,2-bis(4-aminophenoxyphenyl)propane, 5.08 g (0.02 mole) of 3,3',5,5'-tetramethyl-4,4'-diaminodiphenylmethane and 100 g of dimethylacetamide were placed and stirred. Subsequent to dissolution of the diamine, 41.8 g (0.08 mole) of 1,10-(decamethylene)bis(trimellitate dianhydride) and 6.44 g (0.2 mole) of benzophenonetetracarboxylic dianhydride were added little by little while cooling the flask over an ice bath. Subsequent to the completion of the addition, they were reacted for 3 hours over the ice bath and further for 4 hours at room temperature. Then, 25.5 g (0.25 mole) of acetic anhydride and 19.8 g (0.25 mole) of pyridine were added, followed by stirring at room temperature for 2 hours. The reaction mixture was then poured into water. A precipitated polymer was collected by filtration and dried, whereby a polyimide resin ($A_3$) was obtained.

Example 1

In accordance with the formulations shown in Table 1, two kinds of paste-like mixtures were first prepared. In Table 1, "TCG-1" means silver powder produced by TOKURIKI KAGAKU CO., LTD.

TABLE 1

| | Formulations | |
|---|---|---|
| | (unit: parts by weight) | |
| Material | No. 1 | No. 2 |
| Polyimide resin | $A_1$ | $A_2$ |
| | 100 | 100 |
| Silver powder (TCG-1) | 150 | 67 |
| Solvent (dimethylacetamide) | 300 | 300 |

The paste-like mixtures (hereinafter called "varnishes") were separately coated to a thickness of 30–50 μm on polyester films and heated at 80° C. for 10 hours and then at 150° C. for 30 minutes, whereby two kinds of conductive bonding films were obtained. They both had good film-forming property (see Table 2).

TABLE 2

| Film-Forming Property of Paste-Like Mixtures | | |
|---|---|---|
| Property | No. 1 | No. 2 |
| Film-forming property | good | good |

Incidentally, in Table 2 (and also Tables 4 and 6 to be described later herein), the designations "good" and "poor" with respect to film-forming property have the following meanings:

Good: A film is stick-free and can be readily peeled off from a polyester film.

Poor: A film is sticky or frail so that it is difficult to peel it off from a polyester film.

Example 2

In accordance with the formulations presented in Table 3, six kinds of paste-like mixtures (No. 3 to No. 8; No. 8: control) were prepared.

TABLE 3

| | Formulations | | | | | |
|---|---|---|---|---|---|---|
| | (unit: parts by weight) | | | | | |
| Material | No. 3 | No. 4 | No. 5 | No. 6 | No. 7 | No. 8 (control) |
| Epoxy resin | YDCN-702 | N-865 | ESCN-195 | N-865 | N-865 | YDCN-702 |
| | 50 | 20 | 10 | 10 | 7 | 100 |
| Phenol resin | H-1 | H-1 | VH-4170 | VH-4170 | VH-4170 | H-1 |

TABLE 3-continued

| | Formulations | | | | | |
|---|---|---|---|---|---|---|
| | (unit: parts by weight) | | | | | |
| Material | No. 3 | No. 4 | No. 5 | No. 6 | No. 7 | No. 8 (control) |
| Curing promoter | 24 2P4MHZ 0.5 | 10 TPPK 0.4 | 6 2MA-OK 0.1 | 6 TPPK 0.5 | 5 TPPK 0.7 | 48 2P4MHZ 1 |
| Polyimide resin | $A_1$ 100 | $A_2$ 100 | $A_3$ 100 | $A_1$ 100 | $A_1$ 100 | — 0 |
| Silver powder | TCG-1 400 | TCG-1 200 | TCG-1 70 | TCG-1 500 | TCG-1 67 | TCG-1 800 |
| Solvent | DMAA 400 | NMP 200 | DMF 100 | DMF 100 | DMF 67 | DMAA 1000 |

In Table 3, the various symbols or abbreviations have the following meanings:

YDCN-702: Product of Tohto Kasei Co., Ltd.; cresol novolak epoxy resin (epoxy equivalent: 220).

N-865: Product of Dainippon Ink & Chemicals, Incorporated; bisphenol novolak epoxy resin (epoxy equivalent: 208).

ESCN-195: Product of Nippon Kayaku Co., Ltd.; cresol novolak epoxy resin (epoxy equivalent: 200).

H-1: Product of Meiwa Plastic Industries, Ltd.; phenol novolak resin (OH equivalent: 106).

VH-4170: Product of Dainippon Ink & Chemicals, Incorporated; bisphenol A novolak resin (OH equivalent: 118).

TCG-1: Product of TOKURIKI KAGAKU CO., LTD.; silver powder.

DMAA: Dimethylacetamide.

NMP: N-methylpyrrolidone.

DMF: Dimethylformamide.

Each of the paste-like mixtures was coated to a thickness of 30–50 μm on a polyester film and then heated first at 80° C. for 10 minutes and next at 150° C. for 30 minutes, whereby a conductive bonding film was obtained. The film-forming property of each paste-like mixture is presented in Table 4.

TABLE 4

| | Film-Forming Property of Paste-Like Mixtures | | | | | |
|---|---|---|---|---|---|---|
| Property | No. 3 | No. 4 | No. 5 | No. 6 | No. 7 | No. 8 (Cont'l) |
| Film-forming property | good | good | good | good | good | poor |

Example 3

In accordance with the formulations shown in Table 5, five kinds of paste-like mixtures, No. 9 to No. 13, were prepared.

TABLE 5

| | Formulations | | | | |
|---|---|---|---|---|---|
| | (unit: parts by weight) | | | | |
| Material | No. 9 | No. 10 | No. 11 | No. 12 | No. 13 |
| Polyimide resin | $A_1$ 100 | $A_2$ 100 | $A_3$ 100 | $A_1$ 100 | $A_1$ 100 |
| Imide compound | BMDADPM 20 | BMDADPM 50 | BMPPP 10 | BMPPP 50 | BMDADPE 30 |
| Silver powder | TCG-1 500 | TCG-1 50 | TCG-1 100 | TCG-1 800 | TCG-1 100 |
| Solvent | DMAA | DMAA | NMP | DMF | DMAA |
| Other additive | BPO 0.1 | DCPO 0.2 | BPO 0.01 | CHPO 0.003 | DCPO 0.1 |

In Table 5, the abbreviations have the following meanings:

BMDADPM: 4,4'-Bismaleimidodiaminodiphenylmethane.

BMPPP: 2,2-Bis(4-(4-maleimidophenoxy)phenyl)propane.

BMDADPE: 4,4'-Bismaleimidodiaminodiphenyl ether.

DMAA: Dimethylacetamide.

NMP: N-methylpyrrolidone.

DMF: Dimethylformamide.

BPO: Benzoyl peroxide.

DCPO: Dicumyl peroxide.

CHPO: Cumene hydroperoxide.

Each of the paste-like mixtures was coated to a thickness of 30–50 μm on a polyester film and then heated first at 80° C. for 10 minutes and next at 150° C. for 15 minutes, whereby a conductive bonding film was obtained. The film-forming property of each paste-like mixture is presented in Table 6.

TABLE 6

Film-Forming Property of Paste-Like Mixtures

| Property | No. 9 | No. 10 | No. 11 | No. 12 | No. 13 |
|---|---|---|---|---|---|
| Film-forming property | good | good | good | good | good |

Test 1

The shear bonding strength of each conductive bonding film obtained in Example 1 was measured. The measurement results are presented in Table 7. Incidentally, the test was conducted in the following manner:

The conductive bonding film was cut into a square piece as large as 4 mm×4 mm. The square piece was held between a silicon chip of 4 mm×4 mm and a silver-plated lead frame. Under 1,000 g load, the silicon chip and the lead frame were compression-bonded at 260° C. for 3 seconds. Using a push-pull gauge, the shear bonding strength was measured both at room temperature and also under heat, that is, after they were heated at 350° C. for 20 seconds.

TABLE 7

Shear Bonding Strength of Conductive Bonding Films

| Property | | No. 1 | No. 2 |
|---|---|---|---|
| Shear bonding strength (kgf/chip) | Room temp. | 15.0 | 14.5 |
| | 350° C. | 0.5 | 0.4 |

Test 2

The shear bonding strength of each conductive bonding film obtained in Example 2 was measured. The measurement results are presented in Table 8. Incidentally, the test was conducted in the following manner:

The conductive bonding film was cut into a square piece as large as 4 mm×4 mm. The square piece was held between a silicon chip of 4 mm×4 mm and a silver-plated lead frame. Under 50 g load, the silicon chip and the lead frame were compression-bonded at 200° C. for 3 minutes. Using a push-pull gauge, the shear bonding strength was measured both at room temperature and also under heat, that is, after they were heated at 350° C. for 20 seconds. From a comparison between Table 7 and Table 8, it is understood that the conductive bonding films (Nos. 3–7) containing the thermosetting resin have higher shear bonding strength at 350° C. than the conductive bonding films (Nos. 1–2) which did not contain any thermosetting resin.

TABLE 8

Shear Bonding Strength of Conductive Bonding Films

| Property | | No. 3 | No. 4 | No. 5 |
|---|---|---|---|---|
| Shear bonding strength (kgf/chip) | Room temp. | 11.0 | 10.5 | 12.3 |
| | 350° C. | 2.0 | 2.5 | 3.0 |
| Property | | No. 6 | No. 7 | No. 8 (Cont'l) |
| Shear bonding strength (kgf/chip) | Room temp. | 9.8 | 13.4 | —* |
| | 350° C. | 1.8 | 2.1 | —* |

*Measurement was not feasible as no film was formed.

Test 3

The shear bonding strength of each conductive bonding film obtained in Example 3 was measured. The measurement results are presented in Table 9. Incidentally, the test was conducted as in Test 2.

TABLE 9

Shear Bonding Strength of Conductive Bonding Films

| Property | | No. 9 | No. 10 | No. 11 |
|---|---|---|---|---|
| Shear bonding strength (kgf/chip) | Room temp. | 10.7 | 12.3 | 17.5 |
| | 350° C. | 1.5 | 3.3 | 2.8 |
| Property | | | No. 12 | No. 13 |
| Shear bonding strength (kgf/chip) | Room temp. | | 15.7 | 11.3 |
| | 350° C. | | 2.3 | 2.8 |

Test 4

The peel bonding strength of each conductive bonding film obtained in Example 1 or Example 2 was measured. The measurement results are shown in Table 10. Incidentally, the test was conducted in the following manner:

The conductive bonding film was cut into a square piece as large as 8 mm×8 mm. The square piece was held between a silicon chip of 8 mm×8 mm and a silver-plated lead frame. Under 1,000 g load, the silicon chip and the lead frame were compression-bonded at 300° C. for 5 seconds. After they were heated at 250° C. for 20 seconds, the peel bonding strength was measured.

TABLE 10

Peel Bonding Strength of Conductive Bonding Films

| Property | No. 1 | No. 2 | No. 3 | No. 4 |
|---|---|---|---|---|
| Peel bonding strength (kgf/chip-250° C.) | >3 | >3 | 1.9 | 1.5 |
| Property | No. 5 | No. 6 | No. 7 | No. 8 (Cont'l) |
| Peel bonding strength (kgf/chip-250° C.) | 1.7 | 1.0 | 2.5 | —* |

*Measurement was not feasible as no film was formed.

From the results shown in Table 10, it is envisaged that the conductive bonding films (Nos. 1–2), which did not contain any thermosetting resin, have higher peel bonding strength at 250° C. than the conductive bonding films (Nos. 3–7) containing the thermosetting resin.

What is claimed is:

1. An electrically conductive bonding film which is non-sticky at room temperature, consisting essentially of a resin film comprising (A) a polyimide resin obtained by reacting a tetracarboxylic dianhydride component, in which the content of a tetracarboxylic dianhydride represented by the following formula (I):

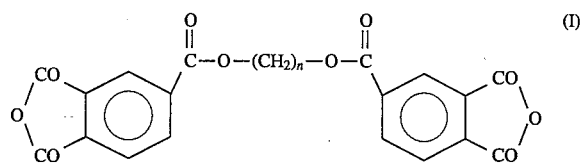

wherein n stands for an integer of 2–20 amounts to at least 70 mole %, with a diamine;

(B) 1–8000 parts by weight of an electrically conductive filler per 100 parts by weight of the polyimide resin; and (C) 0–200 parts by weight of a thermosetting resin or a compound capable of forming a thermosetting resin when heated per 100 parts by weight of the polyimide resin.

2. The bonding film of claim 1, wherein said thermosetting resin is present in an amount of 0.1–200 parts by weight per 100 parts by weight of the polyimide resin.

3. The bonding film of claim 2, wherein the thermosetting resin (C) comprises an epoxy resin, a phenol resin and curing promoter.

4. The bonding film of claim 1, wherein said compound capable of forming a thermosetting resin when heated is present in an amount of 0.1 to 200 parts by weight per 100 parts by weight of the polyimide resin.

5. The bonding film of claim 4, wherein the compound (C) is an imide compound having at least two thermally-crosslinking imido groups per molecule.

6. A method for bonding a semiconductor chip with a substrate, which comprises interposing an electrically conductive bonding film of claim 1 between the chip and the substrate and then subjecting the chip, the film and the substrate to thermocompression bonding.

7. The electrically conductive bonding film of claim 1, wherein the diamine is:

1,2-diaminoethane, 1,3-diaminopropane, 1,4-diaminobutane, 1,5-diaminopentane, 1,6-diaminohexane, 1,7-diaminoheptane, 1,8-diaminoctane, 1,9-diaminononane, 1,10-diaminodecane, 1,11-diaminoundecane, 1,12-diaminododecane, o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, 3,3'-diaminodiphenyldifluoromethane, 3,4'-diaminodiphenyldifluoromethane, 4,4'-diaminodiphenyldifluoromethane, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 2,2-bis(3-aminophenyl)propane, 2,2'-bis(3,4'-diaminophenyl)propane, 2,2'-bis(4-aminophenyl)propane, 2,2-bis(3-aminophenyl)hexafluropropane, 2,2-(3,4'-diaminodiphenyl)hexafluropropane, 2,2-bis(4-aminophenyl)hexafluropropane, 1,3-bis(3-aminophenoxy)benzene, 1,4-bis(3-aminophenoxy)benzene, 3,3'(1,4-phenylenebis(1-methylethylidene))-bisaniline, 3,4'(1,4-phenylenebis(1-methylethylidene))-bisaniline, 4,4'(1,4-phenylenebis(1-methylethylidene))-bisaniline, 2,2-bis(4-(3-aminophenoxy)phenyl)propane, 2,2-bis(4-(4-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl) sulfide, bis(4-(4-aminophenoxy)phenyl) sulfide, bis(4-(3-aminophenoxy)phenyl) sulfone, or bis(4-(4-aminophenoxy)phenyl) sulfone.

8. A process for producing a non-sticky electrically conductive bonding film consisting essentially of a resin film, comprising the steps of:

(1) obtaining a polyimide resin by reacting a tetracarboxylic dianhydride component with a diamine in a solvent, said tetracarboxylic dianhydride component including at least 70 mole % of a tetracarboxylic dianhydride component represented by the formula (I):

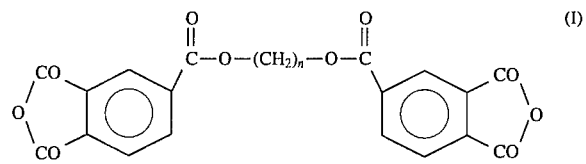

wherein n stands for an integer of 2–20;

(2) adding and mixing 1–8000 parts by weight of a conductive filler per 100 parts by weight of the polyimide resin to the polyimide resin in solvent;

(3) adding and mixing 0–200 parts by weight of a thermosetting resin per 100 parts by weight of the polyimide resin to the mixture of conductive filler, polyimide resin and solvent;

(4) coating the resultant mixture on a base film;

(5) heating the resultant mixture together with the base film so as to at least remove said solvent; and (6) removing the base film.

9. A semiconductor device in which a semiconductor chip and a support member are bonded through an electrically conductive bonding film which is non-sticky at room temperature, said bonding film consisting essentially of a resin film comprising:

(A) a polyimide resin obtained by reacting a tetracarboxylic dianhydride component with a diamine in a solvent, said tetracarboxylic dianhydride component including at least 70 mole % of a tetracarboxylic dianhydride component represented by the formula (I):

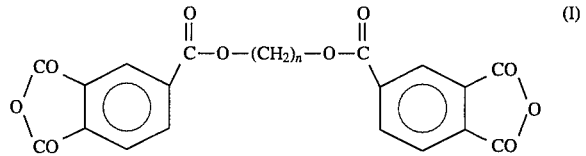

wherein n stands for an integer of 2–20;

(B) 1–8000 parts by weight of a conductive filler per 100 parts weight by the polyimide resin; and (C) 0–200 parts by weight of a thermosetting resin per 100 parts by weight of the polyimide resin.

* * * * *